United States Patent
Morikawa et al.

[11] Patent Number: 6,037,088
[45] Date of Patent: Mar. 14, 2000

[54] METHOD OF MAKING SOLAR CELLS

[75] Inventors: Hiroaki Morikawa; Yoshitatsu Kawama; Satoshi Arimoto; Yukio Shinoda; Takashi Ishihara, all of Tokyo, Japan

[73] Assignee: Mitsubishi Denki Kabushiki Kaisha, Tokyo, Japan

[21] Appl. No.: 08/799,570

[22] Filed: Feb. 12, 1997

[30] Foreign Application Priority Data

Apr. 26, 1996 [JP] Japan .................................. 8-106591

[51] Int. Cl.$^7$ ................................................ H01L 31/0203
[52] U.S. Cl. .............................. 430/64; 430/97; 430/98; 136/256; 136/258; 136/259
[58] Field of Search .................. 438/57, 64, 97, 438/98; 136/256, 258 PC, 259

[56] References Cited

U.S. PATENT DOCUMENTS

| | | | |
|---|---|---|---|
| 4,773,945 | 9/1988 | Woolf et al. .............................. | 136/256 |
| 5,510,272 | 4/1996 | Morikawa et al. .................. | 136/256 X |
| 5,661,618 | 8/1997 | Brown et al. .......................... | 360/97.02 |
| 5,665,607 | 9/1997 | Kawama et al. ........................... | 438/64 |
| 5,683,838 | 11/1997 | Iijima et al. .............................. | 430/20 |

OTHER PUBLICATIONS

Technical Digest, 7th International Photovoltaic Science and LEngineering conference, Nov. 22–26/ 1993, Nagoya, Japan.

*Primary Examiner*—Bernard Codd
*Attorney, Agent, or Firm*—Sughrue, Mion, Zinn, Macpeak & Seas, PLLC

[57] ABSTRACT

A method of making the solar cells includes a step of forming a first electroconductive region on a first surface of a semiconductor substrate having through-holes defined therein and also having an emitter layer formed thereon, a step of disposing the semiconductor substrate on a transparent substrate with a second surface of the semiconductor substrate opposite to the first surface thereof confronting the transparent substrate through a resinous material, a step of bonding the semiconductor substrate and the transparent substrate together by means of the resinous material, and a step of forming a second electroconductive region on the first electroconductive region.

21 Claims, 10 Drawing Sheets

METHOD OF MAKING SOLAR CELLS

BACKGROUND OF THE INVENTION

1. Field of the Invention

The present invention generally relates to solar cells and, more particularly, to the solar cells of a wrap-around type having no electrode appearing on a light receiving surface thereof, but having emitter and base electrodes on a backside surface opposite to the light receiving surface. The present invention also relates to a method of making such solar cells.

2. Description of the Prior Art

FIGS. 9A to 9D and FIGS. 10A to 10D illustrate the sequence of manufacturing VEST cells which are representative of prior art wrap-around solar cells disclosed by M. Deguchi et al., "A Novel Fabrication Technique for Low cost Thin Film Polycrystalline Silicon Solar Cells", Technical Digest of the 7th International Photovoltaic Science and Engineering Conference, p243 (1993). The wrap-around solar cells are known having a structure in which no electrode show up on a light receiving surface of each solar cell and emitter and base electrodes are disposed on a backside surface of the respective solar cell opposite to the light receiving surface.

FIGS. 9A to 9D are plan views of the VEST cells as viewed from the backside surface thereof whereas FIGS. 10A to 10D are cross-sectional views taken along the lines 10A—10A, 10B—10B, 10C—10C and 10D—10D in FIGS. 9A to 9D, respectively. As shown in FIGS. 9A and 10A, a thin silicon substrate 1 of a thickness not greater than 100 $\mu$m and having first and second major surfaces opposite to each other is formed on the first major surface with a plurality of regularly spaced via-holes 3, followed by formation of an emitter layer 2 of a conduction type opposite to that of the silicon substrate 1 by the use of a thermal diffusion technique. In the illustrated example, the silicon substrate 1 has a p-type conductivity and, accordingly, the emitter layer 2 has a n-type conductivity.

Then, as shown in FIGS. 9B and 10B, the silicon substrate 1 having the via-holes 3 and the emitter layer 2 both formed thereon is affixed to a transparent glass plate 4 by the use of a transparent bonding material such as, for example, a transparent silicone resin 5 with the second major surface thereof oriented towards the glass plate 4. The glass plate 4 eventually forms a protective covering for solar cells. The amount of the transparent silicon resin 5 applied to secure the silicon substrate 1 to the glass plate 4 should be carefully controlled to avoid the possibility that the bonding material will undesirably run out of some or all of the via-holes 3. For this purpose, the amount of the transparent silicon resin 5 is so chosen as to correspond to the total volumes of the via-holes 3.

Thereafter, as shown in FIGS. 9C and 10C, a p-type electrode 6 and an n-type electrode 7 are disposed on the silicon substrate 1 and the emitter layer 2, respectively, followed by soldering tab electrodes 8 to the p-type and n-type electrodes 6 and 7, respectively, as shown in FIGS. 9D and 10D.

The prior art method of making the solar cells as discussed above requires utmost care to be taken during application of the transparent bonding resin 5. Unless the amount of the transparent bonding resin 5 is chosen so as to correspond to the total volumes of the via-holes 3, portion of the transparent bonding resin 5 will, when the glass plate 4 is deformed and/or the transparent bonding resin 5 is applied unevenly, run out of the via-holes 3 to spread over local surface areas of the silicon substrate 1 around the via-holes 3 as indicated by 5a in FIGS. 9B and 10B. The resin flashes 5 so formed are cured when and after the assembly is baked and subsequently solidified. Because of this, during formation of the electrodes as shown in FIGS. 9C and 10C that takes place subsequent to the application of the transparent bonding resin 5, the electrodes 6 and 7 may be partly formed on some or all of the resin flashes 5, accompanied by reduction in surface area of contact between the electrodes 6 and 7 and the silicon substrate 1. Reduction in surface area between the electrodes 6 and 7 and the silicon substrate 1 will in turn result in reduction in output characteristic of the resultant solar cells.

When it comes to a mass-production of solar cells, the use of a sputtering technique or a vapor deposition technique, both requiring the use of a vacuum chamber, will give rises to a relatively low throughput and, therefore, in order to increase the throughput, a metal paste printing technique to form the electrodes is essential.

However, according to the prior art method of making the solar cells, since a metal paste is applied to form the electrodes subsequent to solidification of the transparent bonding resin 5, material for the electrodes is required to be of a kind that can be sintered or baked at a temperature, for example, not higher than 300° C. at which the transparent bonding resin 5 will not change in properties. For this reason, as compared with the material that is baked at a temperature higher than 600° C. that is generally employed, the electrodes must have been of a kind having a relatively high resistivity and a relatively high contact resistance.

As discussed above, since in the practice of the prior art method of making the VEST cells the electrodes are formed subsequent to application of the silicon substrate 1 to the glass plate 4, the transparent bonding resin 5 must be uniformly applied to the glass plate 4 to an extremely limited thickness. Once the transparent silicon resin runs out onto areas where the electrodes are subsequently formed, the area of contact surface of the electrodes will decrease. In addition, the metal paste that can be employed for the electrodes is limited to the kind that can be sintered at a temperature sufficiently low to avoid any possible change in properties of the transparent resin 5.

SUMMARY OF THE INVENTION

The present invention has a first object to substantially eliminate the above discussed problems and to provide a method of making an improved solar cell, wherein thin-film silicon solar cells are fitted to a covering glass plate after formation of electrodes.

Further, the present invention has a second object to provide an improved method of making the solar cell, wherein any possible run of a resinous material used to secure the thin-film silicon solar cells to the covering glass plate is suppressed.

Furthermore, the present invention has a third object to provide an improved method of avoiding any possible reduction in yield of the solar cells which would otherwise result from the run of the resinous material.

To this end, the present invention according to one aspect thereof provides a method of making the solar cells which comprises a step of forming a first electroconductive region on a first surface of a semiconductor substrate having through-holes defined therein and also having an emitter layer formed thereon, a step of disposing the semiconductor substrate on a transparent substrate with a second surface of the semiconductor substrate opposite to the first surface thereof confronting the transparent substrate through a resinous material, a step of bonding the semiconductor substrate and the transparent substrate together by means of the resinous material, and a step of forming a second electroconductive region on the first electroconductive region.

In the practice of the present invention, subsequent to the formation of the first electroconductive region on the first surface of the semiconductor substrate and prior to disposition of the semiconductor substrate on the transparent substrate, a coating of a fluorine containing resin may be formed on the first surface of the semiconductor substrate. In such case, the coating of a fluorine containing resin so formed has to be removed after the semiconductor substrate and the transparent substrate have been bonded together and prior to formation of the second electroconductive region on the first electroconductive region.

The coating of a fluorine containing resin may be made of poly(fluroalkymethacrylate), such as Florad FC-722 (trade name) which is available from Sumitomo 3M Co. Ltd.

Disposition of the semiconductor substrate, which may be typically either a crystalline silicon or a polycrystalline silicon, on the transparent substrate which may be typically a reinforced glass plate for solar cells, is carried out by applying the transparent resin such as, for example, typically a silicone resin, only to areas of one of the semiconductor substrate and the transparent substrate which are to be bonded with corresponding areas of the other of the semiconductor substrate and the transparent substrate so that the semiconductor substrate can be laid on the transparent substrate through the transparent resin intervening therebetween.

Bonding of the semiconductor substrate and the transparent substrate may be carried out with care taken to avoid the possibility that the transparent resin may run out of the through-holes to spread over the first electroconductive region.

The present invention according to another aspect thereof also provide solar cells which comprises a transparent substrate, a semiconductor substrate bonded to the transparent substrate through a transparent resin and having through-holes defined therein and also having an emitter layer formed thereon, a high-temperature sintered first electroconductive region formed on the semiconductor substrate and a second electroconductive region formed on the first electroconductive region. The first electroconductive region are formed so as to surround each through-hole defined in the semiconductor substrate.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

<First Embodiment—FIGS. 1A to 2D>

Figure 1A:
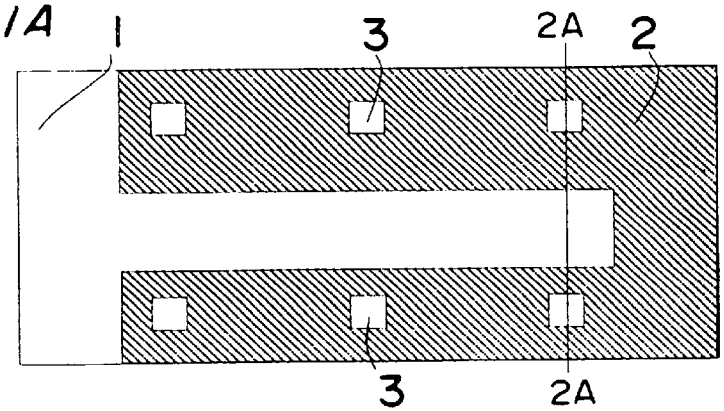
FIGS. 1A to 1D are schematic bottom plan views showing the sequence of manufacture of solar cells according to a first preferred embodiment of the present invention.
Figure 2A:
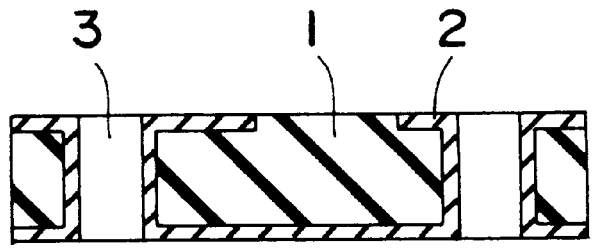
FIGS. 2A to 2D are schematic cross-sectional views taken along the line 2A—2A, 2B—2B, 2C—2C and 2D—2D in FIGS. 1A to 1D, respectively.

Referring first to FIGS. 1A and 2A, there is shown a generally rectangular thin-walled silicon substrate 1 made of either crystalline silicon or polycrystalline silicon and having first and second major surfaces opposite to each other. This silicon substrate 1 has a plurality of regularly spaced via-holes 3 defined therein so as to extend completely across the thickness thereof and also having an emitter layer 2 formed on the first major surface thereof. In the illustrated embodiment, the silicon substrate 1 has a thickness not greater than 100 $\mu$m and also having a p-type conductivity. The emitter layer 2 has a conductivity opposite to that of the silicon substrate 1, that is, a n-type conductivity and is formed by thermally diffusing phosphorus into the first major surface of the silicon substrate 1. It is, however, to be noted that the respective conductivities of the silicon substrate 1 and the emitter layer 2 may be reverse to those described above.

Figure 1B:
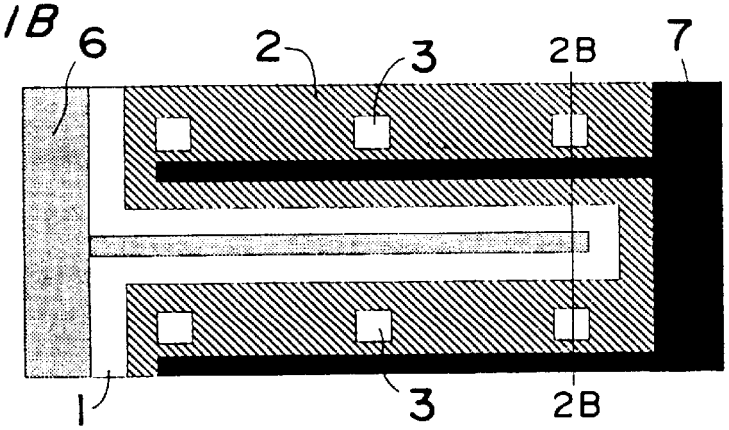
Figure 2B:
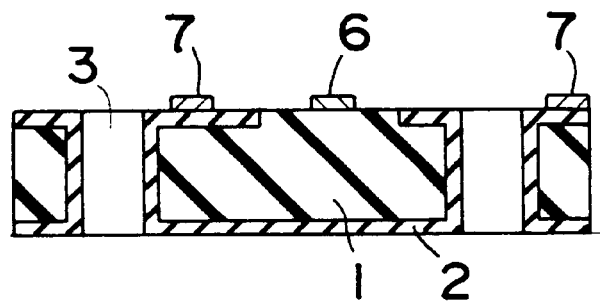

Then, as shown in FIGS. 1B and 2B, a base electrode (p-type electrode) 6 and an emitter electrode (n-type electrode) 7 are formed on the silicon substrate 1 so as to overlay the first major surface of the silicon substrate 1 and the emitter layer 2, respectively. Formation of any one of the base and emitter electrodes 6 and 7 may be carried out by the use of a screen printing technique to form it in a predetermined or required pattern. By way of example, an Al or AgAl paste and an Ag paste may be employed for the base electrode 6 and the emitter electrode 7, respectively, and may, after having been applied to the silicon substrate 1, be sintered for a few minutes at a temperature of 700° C. in dry air to thereby complete the base and emitter electrodes 6 and 7. By so doing, it has been found that the electrodes exhibiting a feasible ohmic characteristic and having a relatively low resistivity could be formed.

Examples of the AlAg paste for p-type electrode comprise the following components.

Ag frit (1–10 $\mu$m$\phi$): 70–78 wt. %
Al frit (4–8 $\mu$m$\phi$): 2 wt. % or less
Glass frit (1–5 $\mu$m$\phi$): 1–10 wt. %
Cellulose resin: 1–5 wt. %
Carbinol resin: 1–5 wt. %

Examples of the Ag paste for n-type electrode comprise the following components.

Ag frit (1–10 $\mu$m$\phi$): 70–80 wt. %
Glass frit (1–5 $\mu$m$\phi$): 1–10 wt. %
Cellurose resin: 1–5 wt. %
Carbinol resin: 1–5 wt. %

Figure 1C:
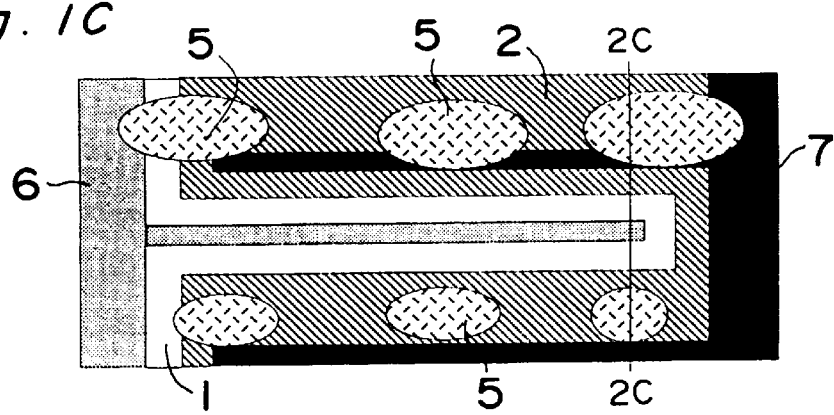
Figure 2C:
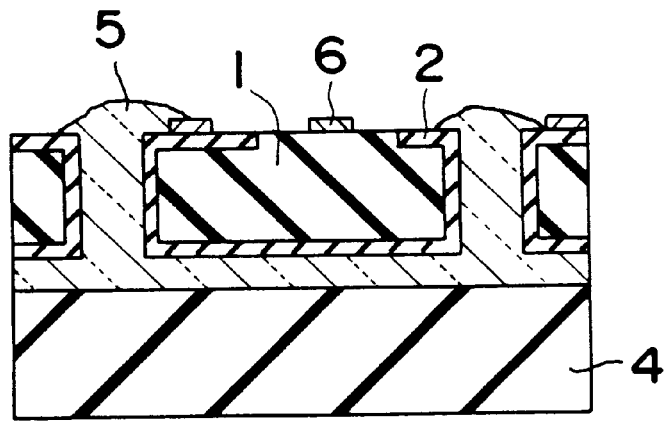

As shown in FIGS. 1C and 2C, the silicon substrate 1 having the electrodes 6 and 7 formed thereon is bonded to a transparent covering glass plate 4 with the second major surface thereof held in contact with the transparent covering glass plate 4. To secure the silicon substrate 1 to the transparent covering glass plate 4, a transparent resin 5 such as, for example, a silicon resin, is applied to the transparent covering glass plate 4 prior to the silicon substrate 1 brought into contact with the transparent covering glass plate 4. After the securement, the assembly is deaerated and is subsequently sintered for a few minutes at a temperature of, for example, 150° C. to cure the transparent resin 5.

Figure 1D:
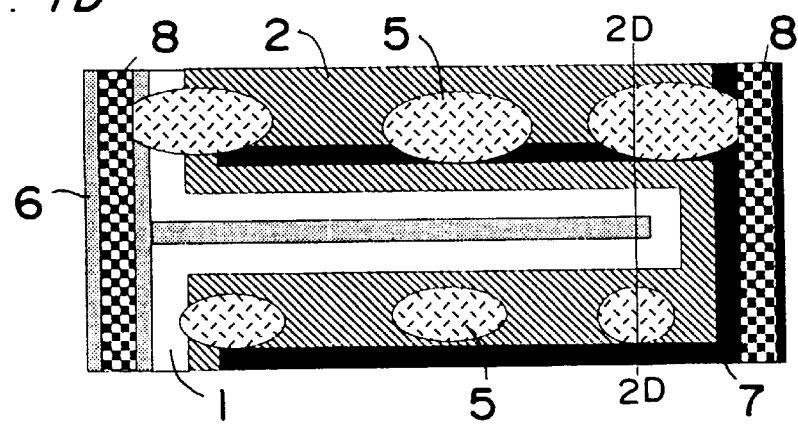
Figure 2D:
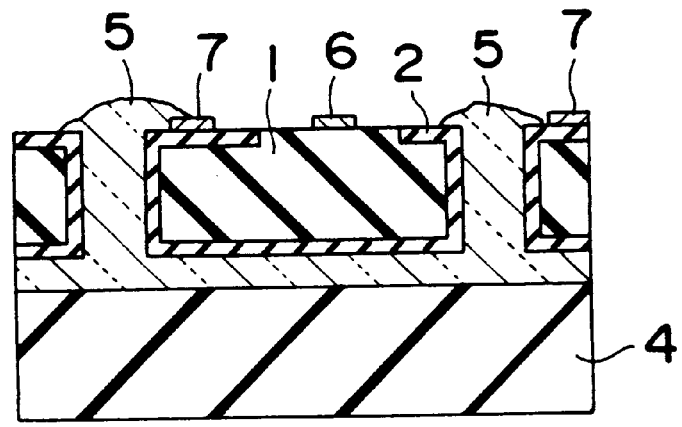

Finally, as shown in FIGS. 1D and 2D, tab electrodes 8 are soldered to the base and emitter electrodes 6 and 7, respectively, to thereby complete securement of the VEST cells to the covering glass plate.

The following Table 1 illustrates comparison of electric characteristics exhibited by different materials for the Ag paste electrodes, which can be sintered at different sintering temperatures, respectively.

TABLE 1

| Type | Sintering Temp.(° C.) | Resistivity (Ωcm) |
| --- | --- | --- |
| Low-temp. Sintering | 150 | $1 \times 10^{-4}$ |
| High-temp. Sintering | 700 | $2 \times 10^{-6}$ |

From Table 1 above, it is clear that the use of the high-temperature sintering paste material is effective to accomplish a considerable reduction in specific resistance of the electrodes.

According to the foregoing embodiment, formation of the electrodes 6 and 7 on the silicon substrate 1 during the process step shown in FIGS. 1B and 2B makes it possible to employ the high-temperature sintering paste material therefor and, therefore, both of the contact resistance and the resistivity of the electrodes can be reduced considerably, resulting in reduction in series resistance of the resultant solar cells.

Where such paste electrodes are employed, each of the electrodes after having been sintered exhibits a thickness within the range of 10 to 20 $\mu$m and, therefore, the acceptable range of amount of the transparent resin 5 that can be employed during the process step shown in FIGS. 1C and 2C to secure the semiconductor substrate 1 to the transparent covering glass plate 4, can be increased to such a value that the applied transparent resin will, after having run out of the via-holes 3, will now spread over the metal pasted electrodes.

Moreover, in contrast to the prior art in which an extremely precise control of the thickness to which the paste is applied is required, the amount of the transparent resin 5 applied in the practice of the method of the present invention may be such that the transparent resin 5 running out of the via-holes 3 will not substantially reach areas of the silicon substrate 1 where the tab electrodes 8 are subsequently formed and, accordingly, the thickness to which the transparent resin 5 is applied can be advantageously increased. More specifically, the present invention makes it possible to increase the thickness to which the transparent resin can be applied to a value 1.5 times that employed in the practice of the prior art method. If the light receiving surface of the silicon substrate 1 is flat or if the light receiving surface of the silicon substrate 1 is formed with a light-trapping texture structure, the thickness of the transparent resin 5 within the range of 1 to 2 $\mu$m or within the range of 3 to 5 $\mu$m has been found optimum, respectively. Application of the transparent resin 5 may be carried out by the use of a spinner or a roll coater and, by so doing, the resin thickness can be controlled sufficiently.

<Second Embodiment—FIGS. 3A to 4D>

Figure 3A:
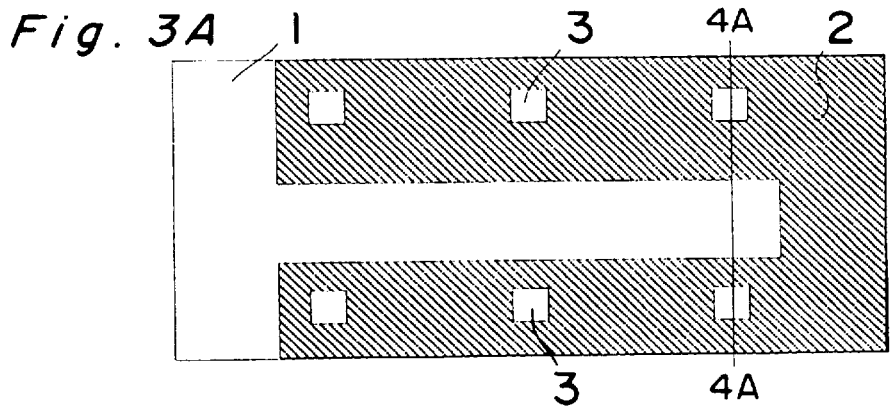
FIGS. 3A to 3D are schematic bottom plan views showing the sequence of manufacture of solar cells according to a second preferred embodiment of the present invention.
Figure 4A:
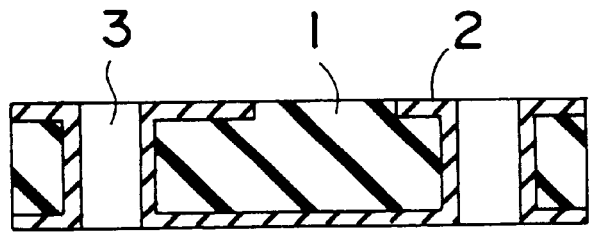
FIGS. 4A to 4D are schematic cross-sectional views taken along the line 4A—4A, 4B—4B, 4C—4C and 4D—4D in FIGS. 3A to 3D, respectively.

Referring first to FIGS. 3A and 4A, the silicon substrate 1 made of either crystalline silicon or polycrystalline silicon and having the regularly spaced via-holes 3 and the emitter layer 2 is prepared as is the case with the foregoing embodiment. Thereafter, as shown in FIGS. 1B and 2B, the base electrode 6 is formed on the first major surface of the silicon substrate 1's and however, in the practice of the second embodiment of the present invention, the emitter layer 2 is so patterned as to surround the via-holes 3. In the illustrated embodiment, the silicon substrate 1 has a thickness not greater than 100 $\mu$m and also having a p-type conductivity. The emitter layer 2 has a conductivity opposite to that of the silicon substrate 1, that is, a n-type conductivity and is formed by thermally diffusing phosphorus into the first major surface of the silicon substrate 1. It is, however, to be noted that the respective conductivities of the silicon substrate 1 and the emitter layer 2 may be reverse to those described above.

Figure 3B:
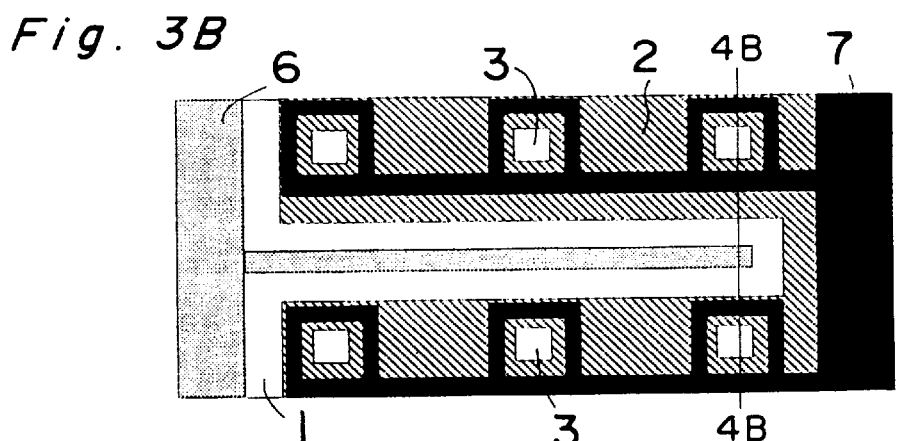
Figure 4B:
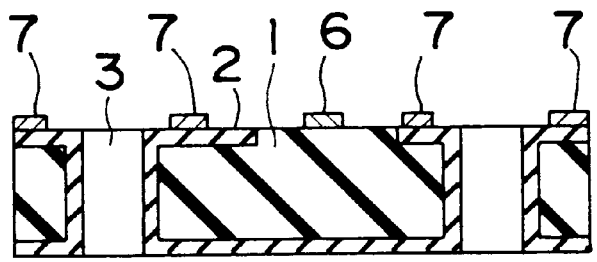

Then, as shown in FIGS. 3B and 4B, the base electrode 6 is formed on the first major surface of the silicon substrate 1 and the emitter electrode 7 is similarly formed on the emitter layer 2 in a pattern sufficient to allow it to surround the via-holes 3.

Figure 3C:
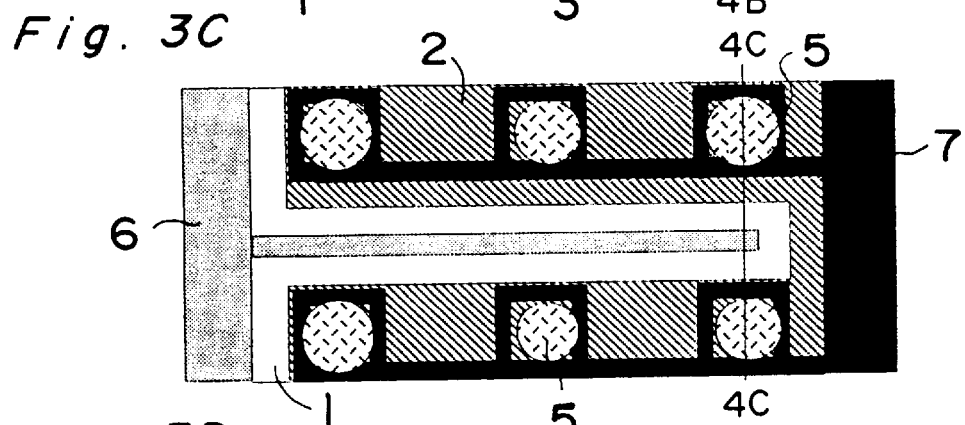
Figure 3D:
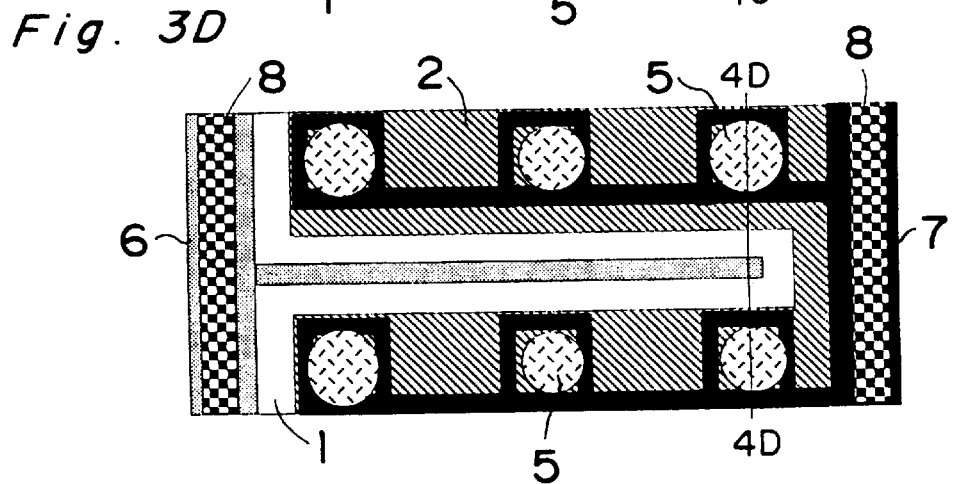
Figure 4C:
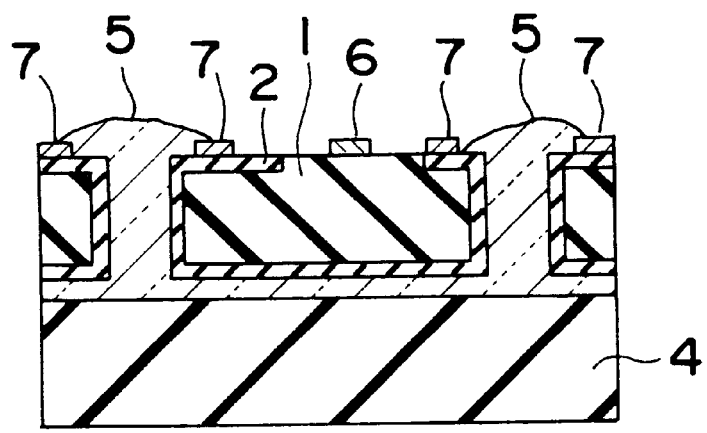
Figure 4D:
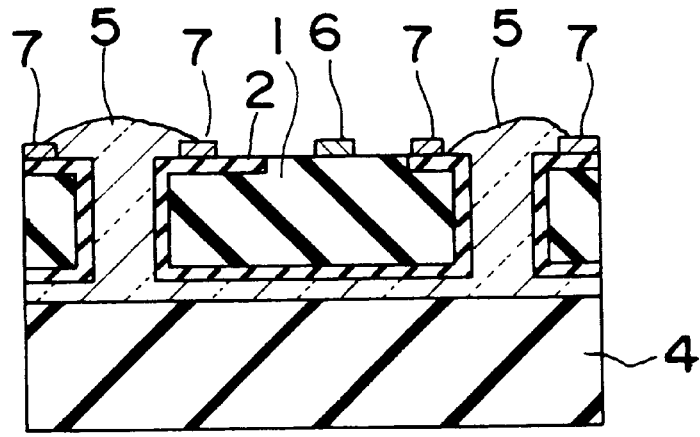

After the formation of the electrodes 6 and 7, the silicon substrate 1 is bonded to the transparent covering glass plate 4 with the second major surface thereof held in contact with the transparent covering glass plate 4 as shown in FIGS. 3C and 4C, followed by soldering the tab electrodes 7 and 8 as shown in FIGS. 3D and 4D.

In the practice of the method according to the second embodiment of the present invention, the emitter electrode 7 is so patterned as to surround the via-holes 3 as shown in FIGS. 3B and 4B and, accordingly, the amount of the transparent resin 5 corresponding to the sum of respective volumes of portions of the emitter electrode 7 which are aligned with the via-holes 3 can be applied.

Accordingly, as compared with the first embodiment of the present invention, the acceptable range of amount of the transparent resin 5 that can be employed during the process step shown in FIGS. 3C and 4C to secure the semiconductor substrate 1 to the transparent covering glass plate 4, can further be increased. A series of experiments have shown that even though the transparent resin 5 was applied to a thickness 1.5 times that employed in the practice of the first embodiment of the present invention, no transparent resin so applied did not spread to those areas where the tab electrodes 8 are subsequently formed.

According to the second embodiment of the present invention, as shown in FIGS. 3D and 4D, the transparent resin 5 running out of substantially all of the via-holes 3 did not spread over the emitter electrode and then over to the areas where the tab electrodes 8 are subsequently formed.

<Third Embodiment—FIGS. 5A to 6D>

Figure 5A:
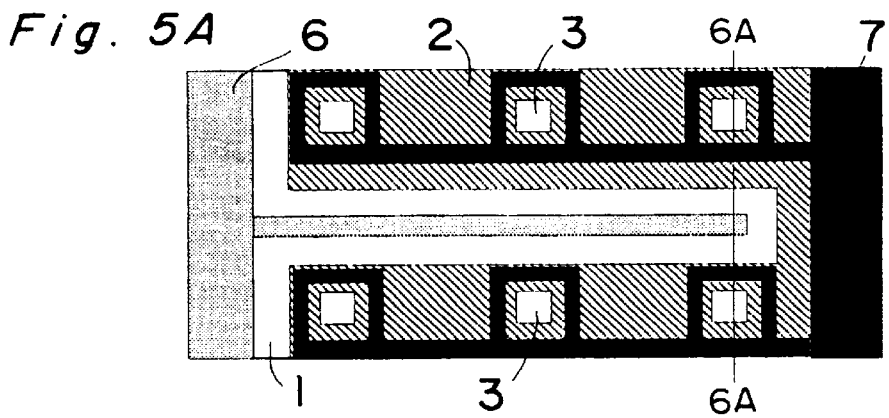
FIGS. 5A to 5D are schematic bottom plan views showing the sequence of manufacture of solar cells according to a third preferred embodiment of the present invention.
Figure 6A:
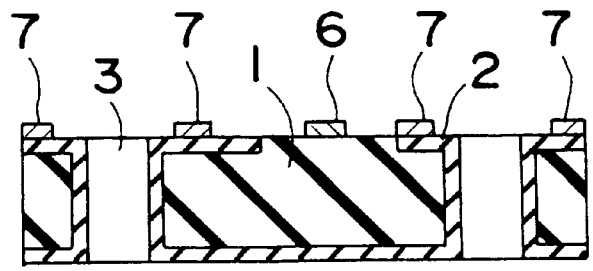
FIGS. 6A to 6D are schematic cross-sectional views taken along the line 6A—6A, 6B—6B, 6C—6C and 6D—6D in FIGS. 5A to 5D, respectively.

Referring first to FIGS. 5A and 6A, the silicon substrate 1 made of either crystalline silicon or polycrystalline silicon and having the base electrode 6 and the emitter electrode 7 both formed on the silicon substrate 1 in a manner similar to that described in connection with the second embodiment of the present invention as shown in FIGS. 3B and 4B.

Figure 5B:
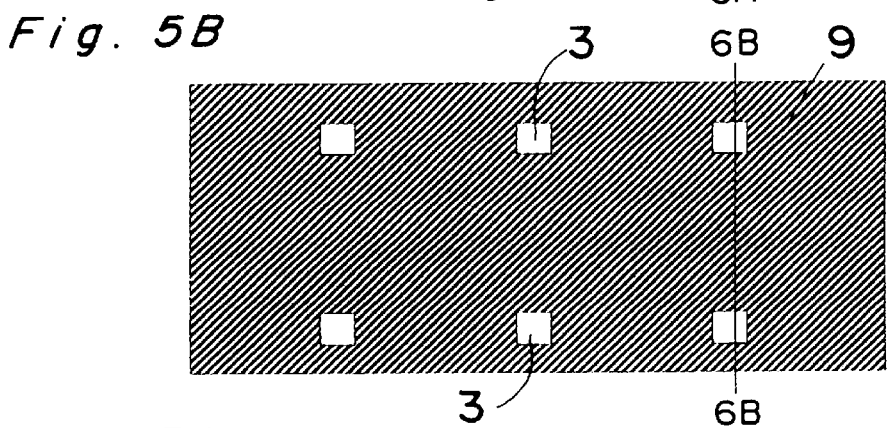
Figure 6B:
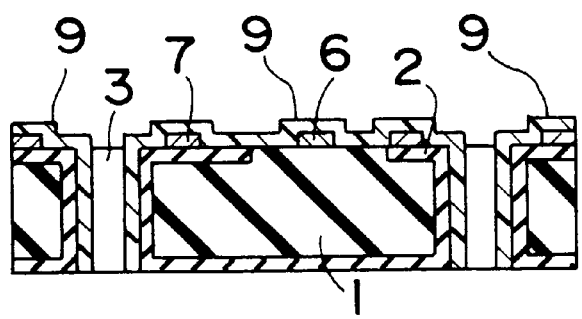

After the formation of the base and emitter electrodes 6 and 7 on the silicon substrate 1, and as shown in FIGS. 5B and 6B, a fluorine coating material such as, for example, a fluorine homopolymer is applied by the use of, for example, a spray gun to the first major surface of the silicon substrate 1 where the electrodes 6 and 8 are formed, so as to form a fluorine coating 9 over the entire surface thereof. After the application, the fluorine coating 9 is dried by allowing it to stand.

The fluorine coating 9 may be deposited on a side faces of each of the via-holes 3 as shown in FIG. 6B, but should not extend to the second major surface of the silicon substrate 1 which would eventually serve as a light receiving surface.

Figure 5C:
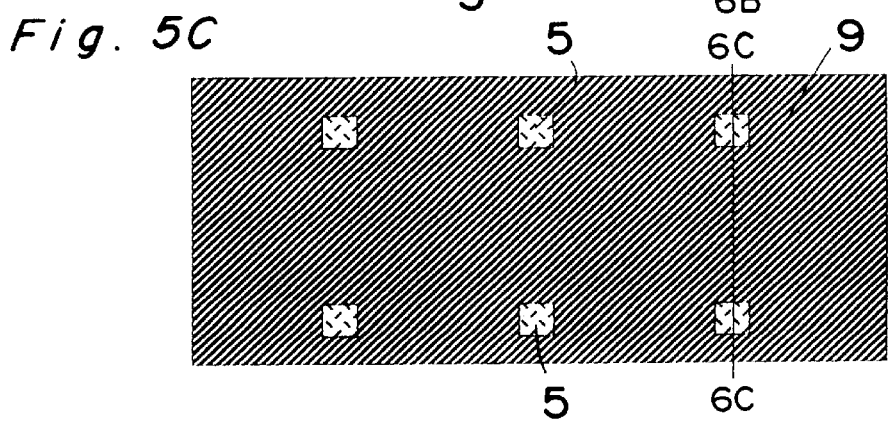
Figure 6C:
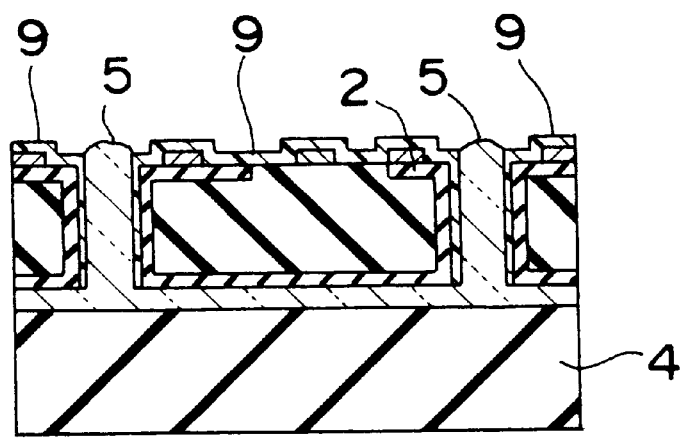

Then as shown in FIGS. 5C and 6C, the silicon substrate 1 having the fluorine coating 9 is bonded to the transparent covering glass plate 4 with the second major surface thereof confronting the transparent covering glass plate 4. The assembly is then deaerated and is subsequently sintered to cure the transparent resin 5, followed by removal of the fluorine coating 9. Although the fluorine coating 9 can be removed by the use of a solvent such as, for example, a fluorine inactive liquid, the fluorine coating 9 can be removed by thermal decomposition which takes place when the temperature is increased to 200° C. following the temperature (150° C. retained for a few minutes) employed to cure the transparent resin 5.

Figure 5D:
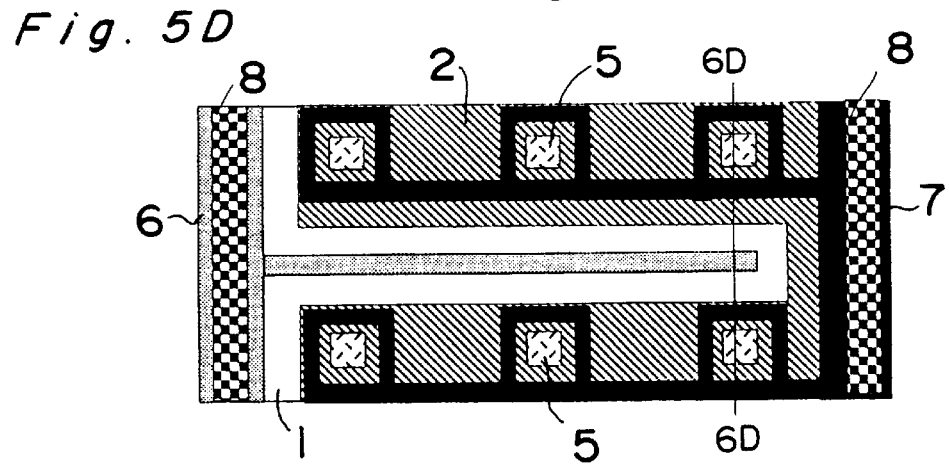
Figure 6D:
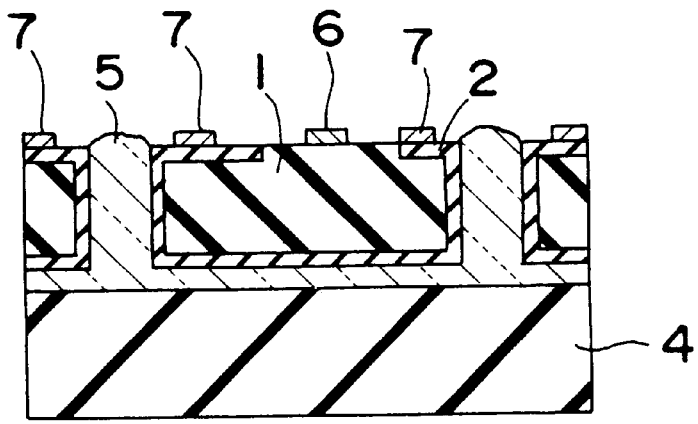

Finally, as shown in FIGS. 5D and 6D, the tab electrodes 8 are formed in a manner similar to that according to any one of the first and second embodiments, to thereby complete securement of the VEST cells to the covering glass plate.

According to the third embodiment of the present invention, the fluorine coating 9 is formed during the process step shown in FIGS. 5B and 6B. A series of experiments have shown that even though the transparent resin 5 may run out of the via-holes 3, the running transparent resin 5 will be repelled by the fluorine coating 9 into the via-holes 3, far from being spread over the surface of the fluorine coating 9. Because of the fluorine coating 9 having a property of repelling the transparent resin 5, the silicon substrate 1 having the electrodes formed thereon may be considered supported afloat the transparent resin 5 and, therefore, even though the amount of the transparent resin 5 applied is fluctuated, or the transparent resin 5 is applied unevenly, and/or the covering glass plate 4 warps, the assembly can be assuredly secured to the covering glass plate with no bubble contained therein and also with no run of the transparent resin 5.

Although in the practice of the third embodiment of the present invention, the emitter electrode 7 has shown as patterned so as to surround the via-holes 3, it may not be limited to and may be patterned in a manner as in the first embodiment shown in FIGS. 1B and 2B.

<Fourth Embodiment—FIGS. 7A to 8C>

In the practice of the fourth embodiment of the present invention, a reinforced glass plate 10 for exclusive use in solar cells is employed in place of the covering glass plate 4 employed in any one of the foregoing embodiments. As shown in FIG. 2D, the reinforced glass plate 10 of a generally rectangular configuration is shown as having ten solar cells mounted thereon.

Figure 7A:
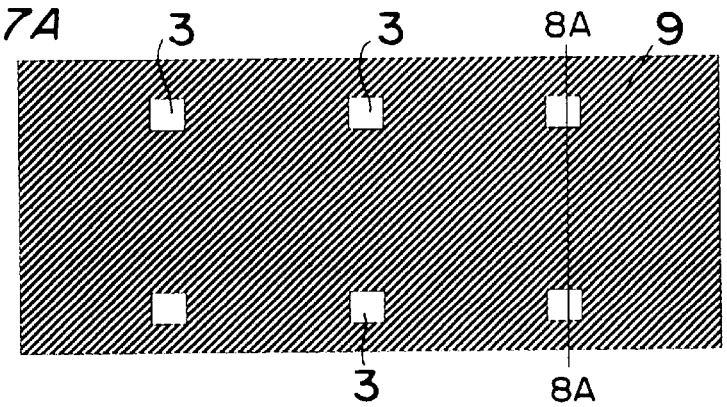
FIGS. 7A to 7D are schematic bottom plan views showing the sequence of manufacture of solar cells according to a fourth preferred embodiment of the present invention.
Figure 8A:
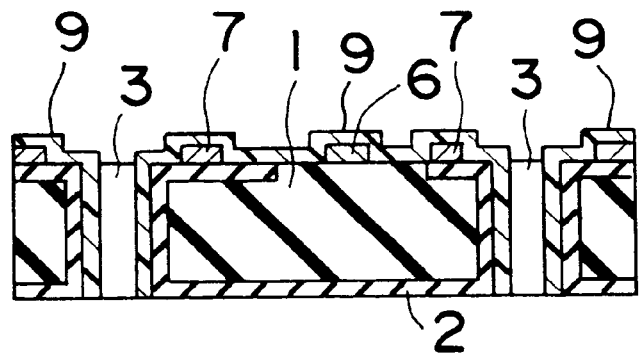
FIGS. 8A to 8c are schematic cross-sectional views taken along the line 8A—8A, 8B—8B and 8C—8C in FIGS. 7A, 7B and 7C, respectively.

Referring first to FIGS. 7A and 8A, the silicon substrate 1 having the electrodes formed in a manner similar to the third embodiment of the present invention has the fluorine coating 9 formed on the first major surface thereof so as to cover the electrodes 6 and 7.

Figure 7B:
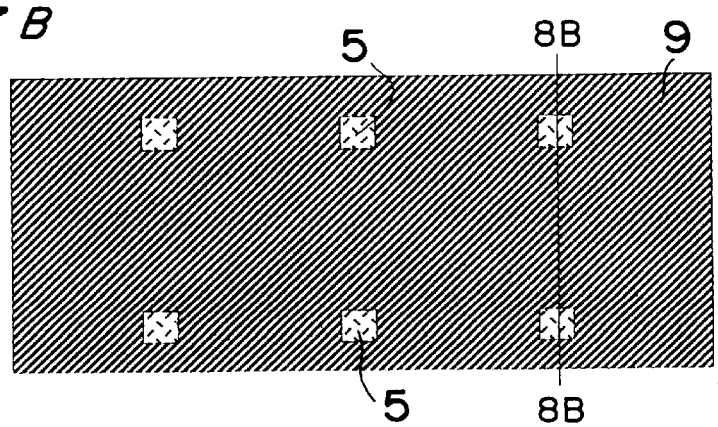

Then, as shown in FIG. 7B, the transparent resin 5 is applied over one surface of the reinforced glass plate 10. In such case, it is necessary to fill up surface irregularities of a few tens of micrometers found on such surface of the reinforced glass plate 10 with the applied transparent resin 5 and then to uniformly apply the transparent resin 5 from a protruding upper surface. Bonding of the solar cells may be accomplished satisfactorily if the transparent resin 5 is over the entire surface of the reinforced glass plate may be sufficient. However, since the thickness to which the transparent resin 5 is applied amounts to a few tens of micrometers and in order to minimize the amount of the transparent resin 5 used, only surface areas of the reinforced glass plate 10 where the solar cells are bonded are applied with the transparent resin 5 in the practice of the fourth embodiment of the present invention. In addition, application of the transparent resin 5 over a relatively large surface is carried out by the use of a roll coater.

Figure 7C:
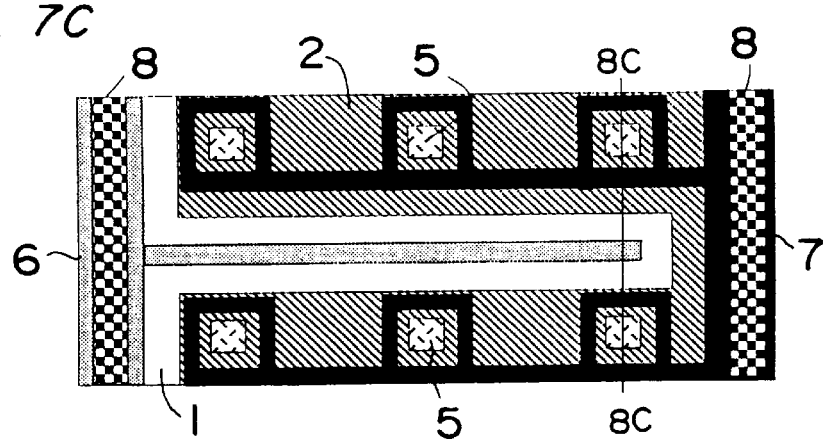
Figure 8B:
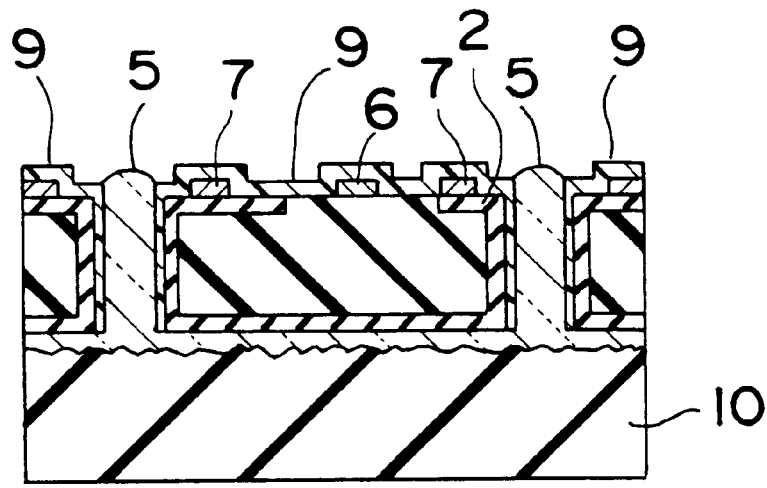
Figure 8C:
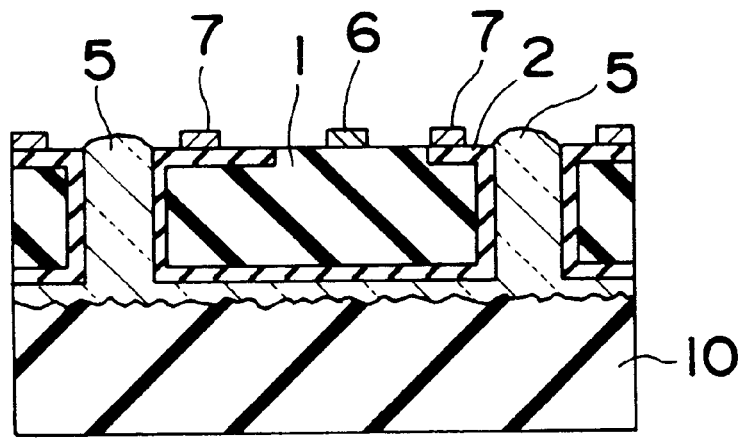
Figure 9A:
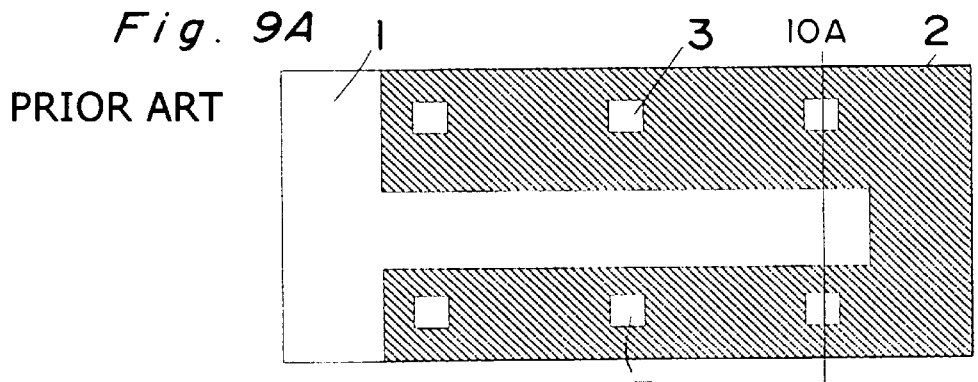
FIGS. 9A to 9D are schematic bottom plan views showing the sequence of manufacture of the prior art solar cells.
Figure 9B:
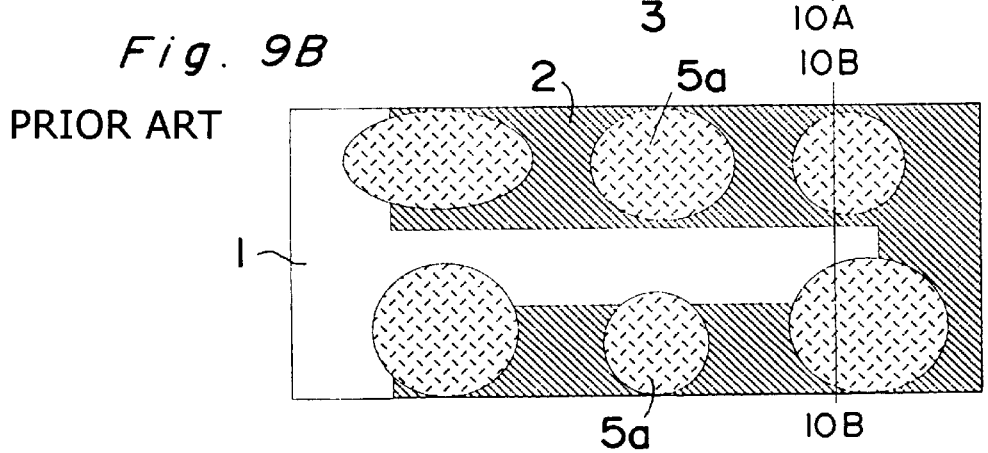
Figure 9C:
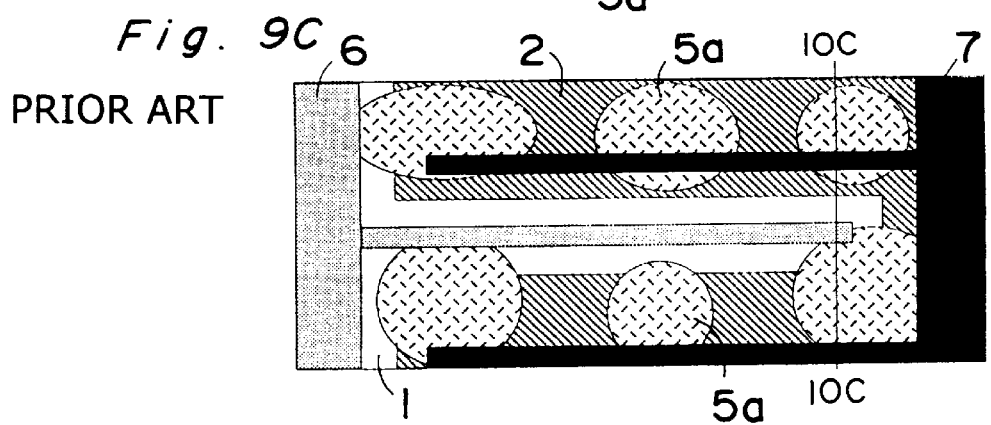
Figure 9D:
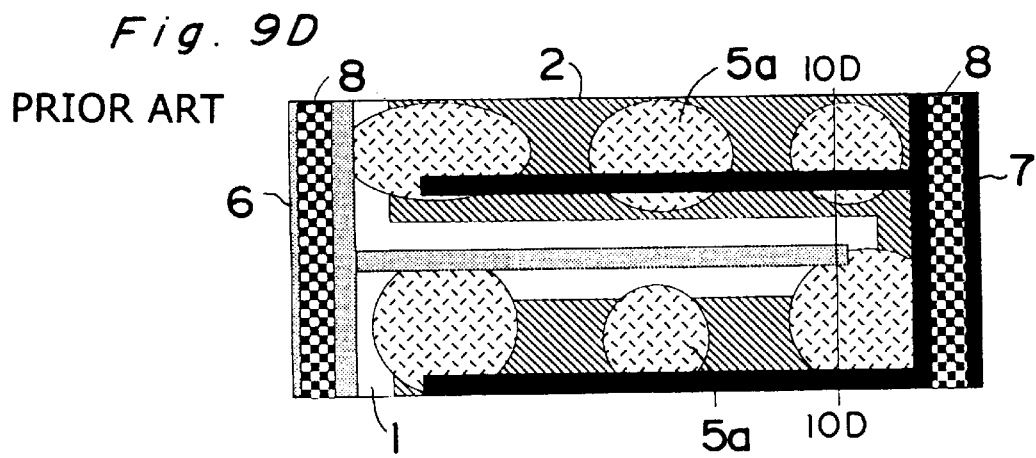
Figure 10A:
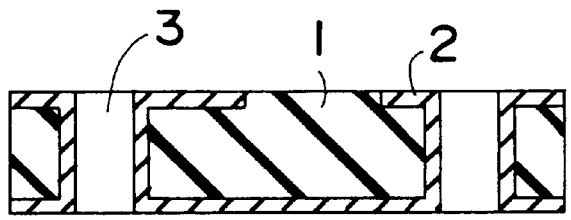
FIGS. 10A to 10D are schematic cross-sectional views taken along the line 10A—10A, 10B—10B, 10C—10C and 10D—10D in FIGS. 9A to 9D, respectively.
Figure 10B:
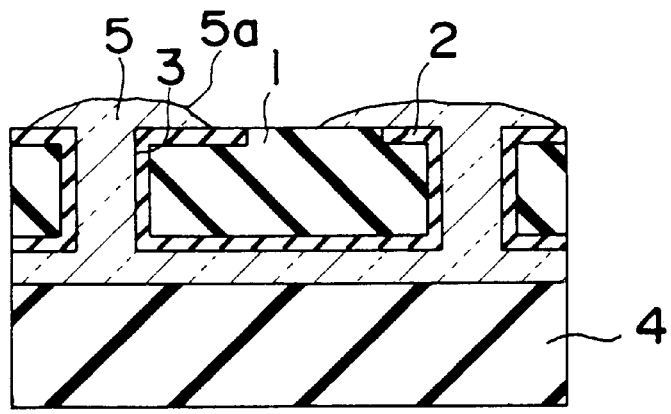
Figure 10C:
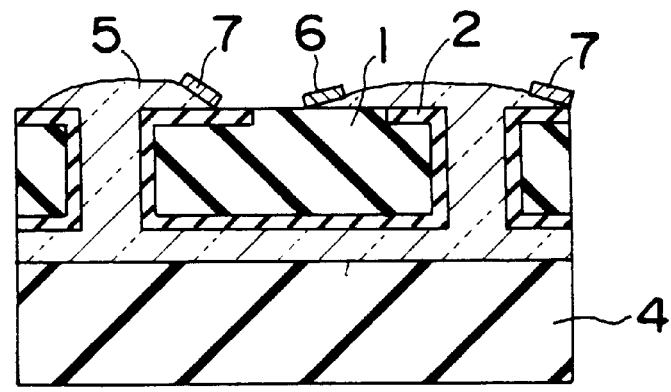
Figure 10D:
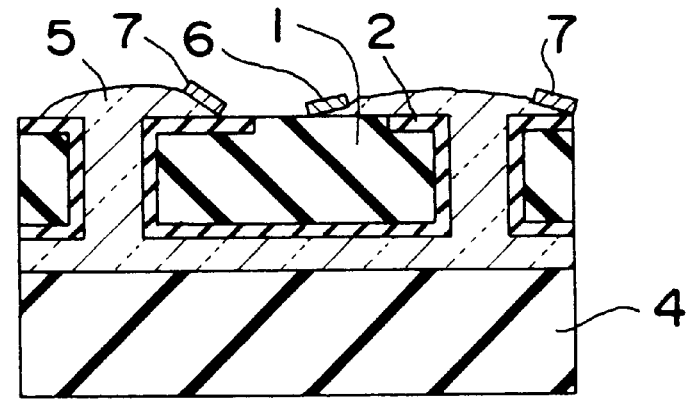

Then as shown in FIGS. 7B and 8B, the silicon substrate 1 is bonded to the reinforced glass plate 10 by the transparent resin 5, followed by deaeration and sintering to cure the transparent resin 5. Thereafter, the fluorine coating 9 is removed. Finally, as shown in FIGS. 7C and 8C, the tab electrodes 8 are soldered in a manner similar to any one of the foregoing embodiments, to thereby complete securement of the VEST cells to the reinforced glass plate.

Figure 7D:
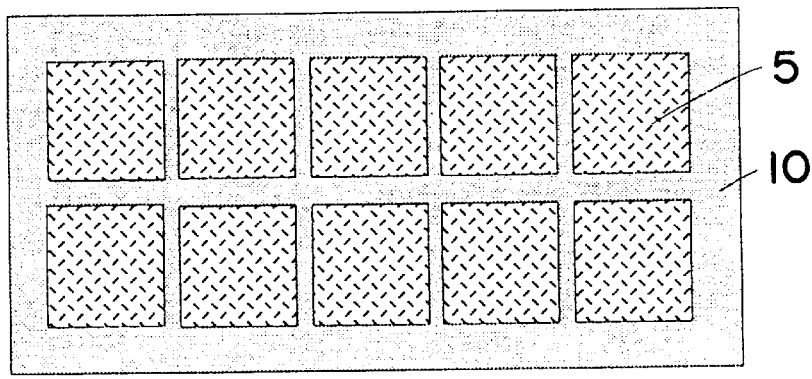

A step for coating silicon resin on a large area glass substrate may be carried out by a coating means such as roll coater. FIG. 7D shows one embodiment wherein ten solar cells are bonded on the substrate 10 by the silicon resin 5. After coating, the substrate is attached in the manner as described above.

The covering glass plate 4 employed in any one of the first to third embodiments of the present invention has a relatively high surface flatness and also is substantially free from warp and, even if it has surface irregularities, they may be of a size not greater than 1 Oim. The method according to any one of the first and second embodiments of the present invention is particularly effective when such covering glass plate is employed and is advantageously applicable to a module of a relatively small surface area, application of which is limited to, for example, solar cars, satellites or solar battery measurement instruments, but cannot be implemented with the reinforced glass plate of a type employed in a module of a relatively large surface area, for example, a few tens of square centimeters to 1 square meter, that is used outdoor as will be described below.

One of the opposite surfaces of the reinforced glass plate for exclusive use in the solar battery now available in the market has surface irregularities in the order of a few tens of micrometers so that the incoming light can be reflected. However, the solar battery with the electrodes already formed is generally required to be bonded to such one of the opposite surfaces of the reinforced glass plate where the surface irregularities appear, and in this respect, the method according to any one of the first and second embodiments of the present invention cannot be employed satisfactorily.

Also, it may be possible to avoid the necessity of bonding the cells to the surface of the reinforced glass plate where the surface irregularities appear, if after fabrication of modules of a relatively small surface area by the use of the method according to any one of the first and second embodiments of the present invention the cells are bonded to the reinforced glass plate. However, this tends to bring up increase in manufacturing cost and is therefore undesirable. In contrast thereto, according to the fourth embodiment of the present invention, application of the fluorine coating 9 makes it possible to use the reinforced glass plate 10 in place of the covering glass plate 4 employed in the practice of any one of the first to third embodiments of the present invention.

The present invention having been fully described above brings about numerous advantages. Specifically, since during the manufacture of the VEST solar cells the semiconductor substrate is bonded to the covering glass plate after the electrodes have been formed on the semiconductor substrate, not only can a relatively large freedom of choice of material for the electrodes be appreciated, but the acceptable range of amount of the transparent resin that can be applied for bonding the semiconductor substrate to the covering glass plate for use in the solar cells can also be increased, to thereby accomplish a relatively high yield of production.

In addition, since the fluorine coating is formed only on the surface of the semiconductor substrate where the electrodes are formed, the acceptable range of amount of the transparent resin that can be applied for bonding the semiconductor substrate to the covering glass plate for use in the solar cells can further be increased, making it possible to use with the reinforced glass plate exclusively for use in the solar cells.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A method of making solar cells which comprises the steps of:
    forming a first electroconductive region on a first surface of a semiconductor substrate having through-holes defined therein and also having an emitter layer formed thereon;
    disposing the semiconductor substrate on a transparent substrate with a second surface of the semiconductor substrate opposite to the first surface thereof confronting the transparent substrate through a transparent resinous material;
    bonding the semiconductor substrate and the transparent substrate together by means of the transparent resinous material;
    forming a second electroconductive region on the first electroconductive region,
    forming a coating of fluorine containing resin on the first surface of the semiconductor substrate subsequent to the formation of the first electroconductive region on the first surface of the semiconductor substrate and prior to disposition of the semiconductor substrate on the transparent substrate; and
    removing the coating of fluorine containing resin after the semiconductor substrate and the transparent substrate have been bonded together and prior to formation of the second electroconductive region on the first electroconductive region.

2. The method as claimed in claim 1, wherein the coating is of poly(fluoralkylmethacrylate).

3. The method as claimed in claim 1, wherein disposition of the semiconductor substrate on the transparent substrate is carried out by applying the transparent resinous material only to areas of one of the semiconductor substrate and the transparent substrate which are to be bonded with corresponding areas of the other of the semiconductor substrate and the transparent substrate.

4. The method as claimed in claim 1, wherein the transparent resinous material does not overlap the first electroconductive region.

5. The method as claimed in claim 1, wherein the transparent resinous material is a silicon resin.

6. The method as claimed in claim 1, wherein the semiconductor substrate is made of a material selected from the group consisting of crystalline and polycrystalline silicon.

7. The method as claimed in claim 1, wherein the transparent substrate is a reinforced glass plate.

8. A solar cell comprising:
    a transparent substrate;
    a semiconductor substrate bonded to the transparent substrate through a transparent resin and having through-holes defined therein and also having an emitter layer formed thereon;
    a high-temperature sintered first electroconductive region formed on the semiconductor substrate; and
    a second electroconductive region formed on the first electroconductive region,
    wherein the first electroconductive region is formed so as to surround each of the through holes defined in the semiconductor substrate.

9. A method of making solar cells which comprises the steps of:
    forming a first electroconductive region on a first surface of a semiconductor substrate having through-holes defined therein and also having an emitter layer formed thereon, said first electroconductive region formed so as to surround each of said through-holes;
    disposing the semiconductor substrate on a transparent substrate with a second surface of the semiconductor substrate opposite to the first surface thereof confronting the transparent substrate through a transparent resinous material;
    bonding the semiconductor substrate and the transparent substrate together by means of the transparent resinous material; and
    forming a second electroconductive region on the first electroconductive region.

10. The method as claimed in claim 9, wherein disposition of the semiconductor substrate on the transparent substrate is carried out by applying the transparent resinous material only to areas of one of the semiconductor substrate and the transparent substrate which are to be bonded with corresponding areas of the other of the semiconductor substrate and the transparent substrate.

11. The method as claimed in claim 9, wherein the transparent resinous material does not overlap the first electroconductive region.

12. The method as claimed in claim 9, wherein the transparent resinous material is a silicon resin.

13. The method as claimed in claim 9, wherein the semiconductor substrate is made of a material selected from the group consisting of crystalline and polycrystalline silicon.

14. The method as claimed in claim 9, wherein the transparent substrate is a reinforced glass plate.

15. A method of making solar cells comprising the steps of:
    forming a first electroconductive region on a first surface of a semiconductor substrate having through-holes defined therein and also having an emitter layer formed thereon said first electroconductive region formed so as to surround each of said through-holes;
    disposing the semiconductor substrate on a transparent substrate with a second surface of the semiconductor substrate opposite to the first surface thereof confronting the transparent substrate through a transparent resinous material;

bonding the semiconductor substrate and the transparent substrate together by means of the transparent resinous material;

forming a second electroconductive region on the first electroconductive region;

forming a coating of fluorine containing resin on the first surface of the semiconductor substrate subsequent to the formation of the first electroconductive region on the first surface of the semiconductor substrate and prior to disposition of the semiconductor substrate on the transparent substrate; and removing the coating after the semiconductor substrate and the transparent substrate have been bonded together and prior to formation of the second electroconductive region on the first electroconductive region.

16. The method as claimed in claim 15, wherein the coating is of poly(fluoralkylmethacrylate).

17. The method as claimed in claim 15, wherein disposition of the semiconductor substrate on the transparent substrate is carried out by applying the transparent resinous material only to areas of one of the semiconductor substrate and the transparent substrate which are to be bonded with corresponding areas of the other of the semiconductor substrate and the transparent substrate.

18. The method as claimed in claim 15, wherein the transparent resinous material does not overlap the first electroconductive region.

19. The method as claimed in claim 15, wherein the transparent resinous material is a silicon resin.

20. The method as claimed in claim 15, wherein the semiconductor substrate is made of a material selected from the group consisting of crystalline and polycrystalline silicon.

21. The method as claimed in claim 15, wherein the transparent substrate is a reinforced glass plate.

* * * * *